US012787353B2

(12) United States Patent
Hoshi

(10) Patent No.: US 12,787,353 B2
(45) Date of Patent: Nov. 3, 2026

(54) SILICON CARBIDE SEMICONDUCTOR DEVICE

(71) Applicant: FUJI ELECTRIC CO., LTD., Kawasaki (JP)

(72) Inventor: Yasuyuki Hoshi, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 668 days.

(21) Appl. No.: 18/193,750

(22) Filed: Mar. 31, 2023

(65) Prior Publication Data

US 2023/0387291 A1 Nov. 30, 2023

(30) Foreign Application Priority Data

May 26, 2022 (JP) ................................ 2022-085655

(51) Int. Cl.

| | |
|---|---|
| ***H10D 30/66*** | (2025.01) |
| ***H10D 62/10*** | (2025.01) |
| ***H10D 62/17*** | (2025.01) |
| ***H10D 62/832*** | (2025.01) |

(52) U.S. Cl.

CPC ......... *H10D 30/665* (2025.01); *H10D 30/668* (2025.01); *H10D 62/109* (2025.01); *H10D 62/393* (2025.01); *H10D 62/8325* (2025.01)

(58) Field of Classification Search

CPC ............. H10D 62/8325; H10D 62/393; H10D 30/668; H10D 62/157; H10D 62/107; H10D 30/665; H10D 62/105; H10D 62/106

See application file for complete search history.

(56) References Cited

U.S. PATENT DOCUMENTS

2018/0166530 A1 6/2018 Lichtenwalner et al.
2019/0140095 A1* 5/2019 Okumura ............. H10D 30/668
2019/0296143 A1* 9/2019 Wehrhahn-Kilian ........................ H10D 12/00
2020/0328301 A1* 10/2020 Araoka ............. H10D 62/8325

FOREIGN PATENT DOCUMENTS

JP 2019087646 A 6/2019
JP 2020202404 A 12/2020
JP 2021048423 A 3/2021

* cited by examiner

*Primary Examiner* — Lynne A Gurley
*Assistant Examiner* — Jonas T Beardsley
(74) *Attorney, Agent, or Firm* — Rabin & Berdo, P.C.

(57) ABSTRACT

A semiconductor device having, in an outer peripheral portion of an active region, and in a depth direction from a front surface of a semiconductor substrate, first to fourth outer peripheral regions, to thereby form steps that are recessed stepwise toward the center of the semiconductor device by a same width, and are arranged in an ascending order of the proximity to the center in the depth direction. The first, second, and fourth outer peripheral regions, respectively, are formed concurrently with $p^{++}$-type contact regions, a p-type base region, and lower portions of $p^{+}$-type regions in a center portion of the active region. An impurity concentration of the third outer peripheral region is 0.1 times to 0.5 times the impurity concentration of the upper portions of the $p^{+}$-type regions. A voltage withstanding structure is formed in contact with an outer end of the first outer peripheral region.

6 Claims, 5 Drawing Sheets

SILICON CARBIDE SEMICONDUCTOR DEVICE

CROSS REFERENCE TO RELATED APPLICATIONS

This application is based upon and claims the benefit of priority of the prior Japanese Patent Application No. 2022-085655, filed on May 26, 2022, the entire contents of which are incorporated herein by reference.

BACKGROUND OF THE INVENTION

1. Field of the Invention

Embodiments of the invention relate to a silicon carbide semiconductor device.

2. Description of the Related Art

Conventionally, in a silicon carbide semiconductor device containing silicon carbide (SiC) as a semiconductor material, in an outer peripheral portion of an active region, a p-type outer peripheral region is provided that electrically connects a surface electrode on a front surface of a semiconductor substrate and a p-type region configuring a voltage withstanding structure of an edge termination region. The p-type outer peripheral region is formed by extending p-type regions such as $p^{++}$-type contact regions and a p-type base region configuring a device structure of the active region to a vicinity of a border between the active region and the edge termination region, and has a structure in which multiple p-type regions of differing impurity concentrations are disposed adjacent to one another in a depth direction.

FIG. 5 is a cross-sectional view depicting a structure of a conventional silicon carbide semiconductor device. A conventional silicon carbide semiconductor device 110 depicted in FIG. 5 has a voltage withstanding structure 130 in an edge termination region 102 of a semiconductor substrate (semiconductor chip) 140 that contains silicon carbide; the conventional silicon carbide semiconductor device 110 is vertical metal oxide semiconductor electric field effect transistor (MOSFET) having a trench gate structure with insulated gates (MOS gates) having a three-layered structure including a metal, an oxide film, and a semiconductor.

The semiconductor substrate 140 is formed by epitaxially growing an $n^-$-type silicon carbide layer 142 that constitutes an $n^-$-type drift region 112, on a front surface of an $n^+$-type starting substrate 141 that contains silicon carbide. The semiconductor substrate 140 has, as a front surface, a main surface that has the $n^-$-type silicon carbide layer 142 and, as a back surface, a main surface that has the $n^+$-type starting substrate 141. An entire area of the front surface of the semiconductor substrate 140 is flat, that is, between an active region 101 and the edge termination region 102 is free of a step. At the front surface of the semiconductor substrate 140, an entire area of the edge termination region 102 is covered by an insulating film 119.

An entire area of the back surface of the semiconductor substrate 140 (back surface of the $n^+$-type starting substrate 141) is covered by a drain electrode 145. The $n^+$-type starting substrate 141 constitutes an $n^+$-type drain region 111. The active region 101 is disposed in a center (chip center) of the semiconductor substrate 140. Between the active region 101 and the end (the chip end) of the semiconductor substrate 140 is the edge termination region 102. In a center portion (not depicted) of the active region 101, multiple unit cells of the MOSFET, each having the same structure (trench gate structure), are provided adjacently to one another.

In an outer peripheral portion **101*b* of the active region 101, in an entire region between the front surface of the semiconductor substrate 140 and the $n^-$-type drift region 112, adjacently in the depth direction sequentially from the front surface of the semiconductor substrate 140, a first outer peripheral region 115*a* of a $p^{++}$-type, a second outer peripheral region 113*a* of a p-type, and a $p^+$-type region 122*a* (later-described third and fourth outer peripheral regions 124*a*, 123*a*) are provided. These regions configure a single p-type outer peripheral region 125 in an entire area between the front surface of the semiconductor substrate 140 and the $n^-$-type drift region 112, in the outer peripheral portion 101*b* of the active region 101**.

The first and second outer peripheral regions **115*a*, 113*a* are, respectively, formed concurrently with $p^{++}$-type contact regions 115 and a p-type base region 113 that configure a trench gate structure (not depicted) of a center portion of the active region 101, the first and second outer peripheral regions 115*a*, 113*a* surround a periphery of the center portion of the active region 101. Outer ends (ends closest to an end of the semiconductor substrate 140) of the first and second outer peripheral regions 115*a*, 113*a* are terminated by the border between the active region 101 and the edge termination region 102 and are in a single plane orthogonal to the front surface of the semiconductor substrate 140. The $p^+$-type region 122*a* is formed concurrently with $p^+$-type regions 122 of the center portion of the active region 101**.

The $p^+$-type regions 122 reach positions closer to the $n^+$-type drain region 111 (back surface of the semiconductor substrate 140) than are positions of bottoms of trenches (not depicted) configuring the trench gate structure, the $p^+$-type regions 122 have a function of mitigating electric field applied to gate insulating films at the trench bottoms. Each of the $p^+$-type regions 122 is separated into and formed in two stages between the p-type base region 113 and the $n^-$-type drift region 112, in the $n^-$-type silicon carbide layer 142 in the center portion of the active region 101, and is formed by an upper portion (portion facing the front surface of the semiconductor substrate 140) and a lower portion (portion facing the $n^+$-type drain region 111) that are adjacent to each other in the depth direction.

The $p^+$-type region **122*a* is separated into and formed in two stages concurrently with the $p^+$-type regions 122, and is formed by an upper portion (hereinafter, third outer peripheral region) 124*a* and a lower portion (hereinafter, fourth outer peripheral region) 123*a* that are adjacent to each other in the depth direction. Impurity concentrations of the third and fourth outer peripheral regions 124*a*, 123*a* are, respectively, the same as impurity concentrations of the upper portions and the lower portions of the $p^+$-type regions 122. Outer ends of the third and fourth outer peripheral regions 124*a*, 123*a* terminate at a same position closer to the chip center than is the outer end of the second outer peripheral region 113*a* and are in a single plane orthogonal to the front surface of the semiconductor substrate 140**.

In the edge termination region 102, the predetermined voltage withstanding structure 130 is provided. The voltage withstanding structure 130, for example, is a spatial modulation JTE structure having a spatial modulation structure as a junction termination extension (JTE) structure. The JTE structure is a structure in which multiple p-type regions (hereinafter, JTE regions) are disposed in descending order of impurity concentration thereof, in a direction from the chip center to the chip end, in concentric shapes adjacent to one another and surrounding the periphery of the active region.

The voltage withstanding structure 130 is configured by multiple p-type regions 131 and multiple $p^-$-type regions 132 selectively provided between the front surface of the semiconductor substrate 140 and the $n^-$-type drift region 112. All the p-type regions 131 and the $p^-$-type regions 132 are exposed at the front surface of the semiconductor substrate 140 and are in contact with the insulating film 119 on the front surface of the semiconductor substrate 140. The p-type regions 131 and the $p^-$-type regions 132 are formed at a shallow depth d101 of about 0.5 μm from the front surface of the semiconductor substrate 140.

The p-type regions 131 are disposed apart from one another in concentric shapes surrounding the periphery of the active region 101. An innermost one of the p-type regions 131 is disposed in contact with the first outer peripheral region 115*a* and is closer to the chip end than is the first outer peripheral region 115*a*. The $p^-$-type regions 132 are disposed apart from one another in concentric shapes surrounding the periphery of the active region 101. An innermost one of the $p^-$-type regions 132 is provided so that portions thereof are between all the p-type regions 131 that are adjacent to one another, whereby the portions are adjacent to the p-type regions 131 on both sides thereof in a radial direction from the chip center to the chip end, in a plane of the front surface of the semiconductor substrate 140.

The innermost one of the $p^-$-type regions 132 extends closer to the chip center than is an outermost one of the p-type regions 131. All the p-type regions 131 and the innermost one of the $p^-$-type regions 132 are fixed to a potential of a source electrode (not depicted, surface electrode) via the first outer peripheral region 115*a*. Excluding the innermost one of the $p^-$-type regions 132, the $p^-$-type regions 132 are disposed closer to the chip end than are the p-type regions 131. The $n^-$-type drift region 112 is provided so that portions thereof are between all the $p^-$-type regions 132 that are adjacent to one another, the portions being exposed at the front surface of the semiconductor substrate 140 between the $p^-$-type regions 132 that are adjacent to one another.

As for a conventional silicon carbide semiconductor device, a device has been proposed in which a p-type region configuring a voltage withstanding structure is disposed so that a bottom (end facing toward the back surface of the semiconductor substrate) thereof is positioned at a same depth from the front surface of the semiconductor substrate as is a bottom of a p-type region that forms an outermost peripheral end (hereinafter, main junction end) of a main junction (pn junction) of the active region (for example, refer to Japanese Laid-Open Patent Publication No. 2020-202404 and Japanese Laid-Open Patent Publication No. 2021-048423). In Japanese Laid-Open Patent Publication No. 2020-202404, electric field concentration at the main junction end of the active region is suppressed by the p-type region of the JTE structure, the p-type region of the JTE structure being disposed adjacent to an outer side of the p-type region forming the main junction end of the active region, the bottom of the p-type region of the JTE structure being positioned at the same depth as that of the p-type region forming the main junction end.

Further, in Japanese Laid-Open Patent Publication No. 2020-202404, the structure is flat, spanning an entire area of the front surface of the semiconductor substrate, with no step being formed between the active region and the edge termination region, and a p-type region of the active region and a p-type region configuring the JTE structure are formed at positions that are a same depth from the front surface of the semiconductor substrate, whereby positioning accuracy by photolithography is enhanced. In Japanese Laid-Open Patent Publication No. 2021-048423, a p-type region configuring a voltage withstanding structure and a p-type region of the active region are formed concurrently at the same depth, whereby the number of processes is reduced.

Further, as for another conventional silicon carbide semiconductor device, a device has been proposed in which an edge termination region with a spatial modulation structure is configured by an outer end portion (portion facing the chip end) of a $p^+$-type electric field mitigating region that extends to the edge termination region from the active region and an outer end portion of a p-type region configuring a JTE structure in the edge termination region (for example, refer to Japanese Laid-Open Patent Publication No. 2019-087646). In Japanese Laid-Open Patent Publication No. 2019-087646, the spatial modulation structure is configured by the outer end portion of the $p^+$-type electric field mitigating region and the outer end portion of the p-type region configuring the JTE structure and the depth decreases in a direction from the chip center to the chip end, whereby electric field concentration is mitigated in the depth direction as well.

SUMMARY OF THE INVENTION

According to an embodiment of the invention, a silicon carbide semiconductor device includes: a semiconductor substrate containing silicon carbide and having a first main surface and a second main surface that are opposite to each other, an entire area of the first main surface being flat, the semiconductor substrate having, in a plan view of the silicon carbide semiconductor device, an active region at a center of the semiconductor substrate, and a termination region that surrounds a periphery of the active region; a first semiconductor region of a first conductivity type, provided in the semiconductor substrate, and spanning the active region and the termination region; a second semiconductor region of a second conductivity type, provided in the semiconductor substrate, between the first main surface and the first semiconductor region and in the active region; a device structure having a pn junction between the first semiconductor region and the second semiconductor region, a current that passes through the pn junction flowing through the device structure; a second-conductivity-type outer peripheral region formed at the periphery of the active region, the second-conductivity-type outer peripheral region being provided between the first main surface and the first semiconductor region, and between the device structure and the termination region; a voltage withstanding structure configured by a plurality of second-conductivity-type voltage withstanding regions, provided between the first main surface and the first semiconductor region and in the termination region, the plurality of second-conductivity-type voltage withstanding regions being provided apart from one another in a width direction that is parallel to the first main surface, in concentric shapes surrounding the periphery of the active region; a plurality of first electrodes electrically connected to the second semiconductor region and the second-conductivity-type outer peripheral region, the plurality of first electrodes being provided at the first main surface; and a second electrode electrically connected to the first semiconductor region, the second electrode being provided on the second main surface of the semiconductor substrate. The device structure has: a third semiconductor region of the first conductivity type, selectively provided in the semiconductor substrate and between the first main surface and the second semiconductor region, the third semiconductor region being electrically connected to the first electrode, a trench penetrating through the third semiconductor region and the second semiconductor region, and reaching the first semiconductor region, a gate electrode provided in the trench via a gate insulating film, and a plurality of second-conductivity-type high-concentration regions, selectively provided in the semiconductor substrate and between the first semiconductor region and the second semiconductor region, so as to be closer to the second main surface of the semiconductor substrate than is a bottom of the trench, the plurality of second-conductivity-type high-concentration regions having an impurity concentration that is higher than an impurity concentration of the second semiconductor region. The second-conductivity-type outer peripheral region has a plurality of outer peripheral regions that include: a first outer peripheral region closest to the first main surface and in contact with an inner end of the voltage withstanding structure, the first outer peripheral region having a first surface and a second surface that are opposite to each other, the second surface of the first outer peripheral region facing the second main surface of the semiconductor substrate; a second outer peripheral region that is a portion of the second semiconductor region, and that is closer to an end of the semiconductor substrate than is the device structure, the second outer peripheral region being adjacent to the second surface of the first outer peripheral region, and having a first surface and a second surface that are opposite to each other, the second surface of the second outer peripheral region facing the second main surface of the semiconductor substrate; a third outer peripheral region adjacent to the second surface of the second outer peripheral region, and having a first surface and a second surface that are opposite to each other, the second surface of the third outer peripheral region facing the second main surface of the semiconductor substrate; and a fourth outer peripheral region adjacent to the second surface of the third outer peripheral region, a lower surface of the fourth outer peripheral region and a lower surface of each of the plurality of second-conductivity-type high-concentration regions being at a same depth. The first to fourth outer peripheral regions are arranged to form, at an outer end of the second-conductivity-type outer peripheral region, a plurality of steps that are recessed stepwise toward the center of the semiconductor substrate, so as to be in an ascending order of proximity to the center, in a depth direction from the first main surface to the second main surface of the semiconductor substrate, each of the plurality of steps having a same width in the width direction.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
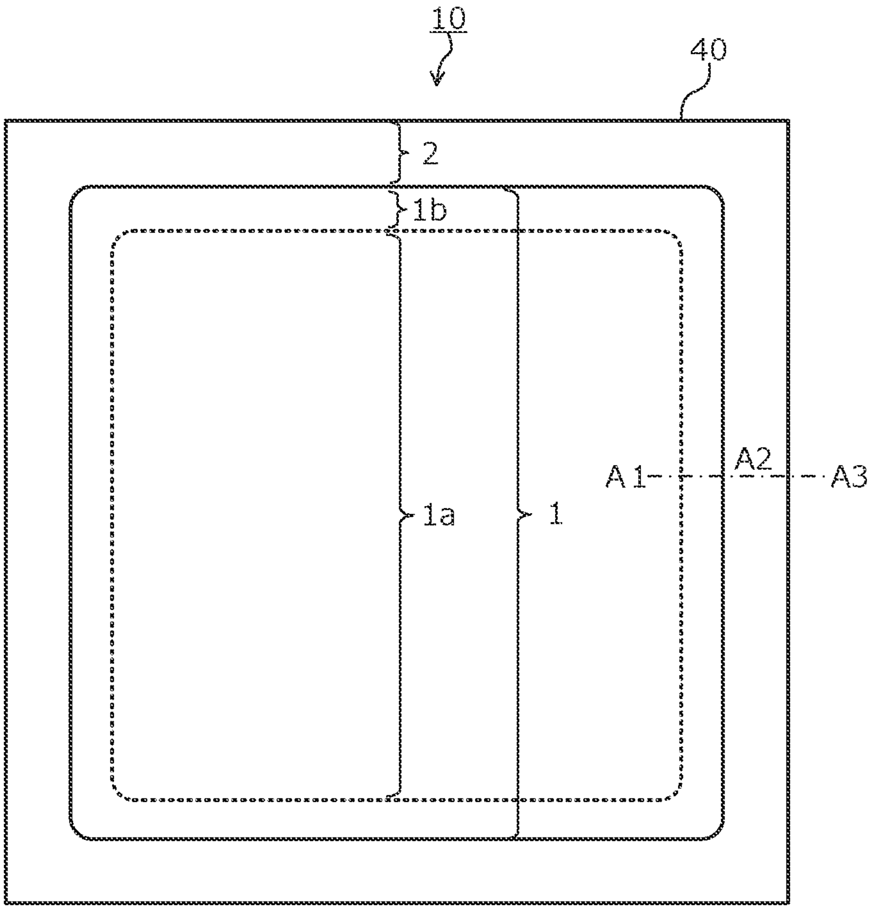
FIG. 1 is a plan view depicting a layout when a silicon carbide semiconductor device according to an embodiment is viewed from a front side of a semiconductor substrate thereof.

First, problems associated with the conventional techniques are discussed. In the conventional silicon carbide semiconductor device 110 (refer to FIG. 5), the impurity concentration of the third outer peripheral region 124*a* and the positions of the outer ends of the first outer peripheral region 115*a*, the second outer peripheral region 113*a*, the third outer peripheral region 124*a*, and the fourth outer peripheral region 123*a* configuring the p-type outer peripheral region 125 are not optimal. Thus, the electric field applied to the lower portion (the $p^+$-type region 122*a*) and the outer end (step portion) of the p-type outer peripheral region 125 increases, whereby the breakdown voltage of the edge termination region 102 decreases. For example, in an instance in which a design value (reference breakdown voltage) of the breakdown voltage of the active region 101 is 1600V, the breakdown voltage of the edge termination region 102 becomes as low as about 1180V (refer to FIG. 4).

Embodiments of a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 2:
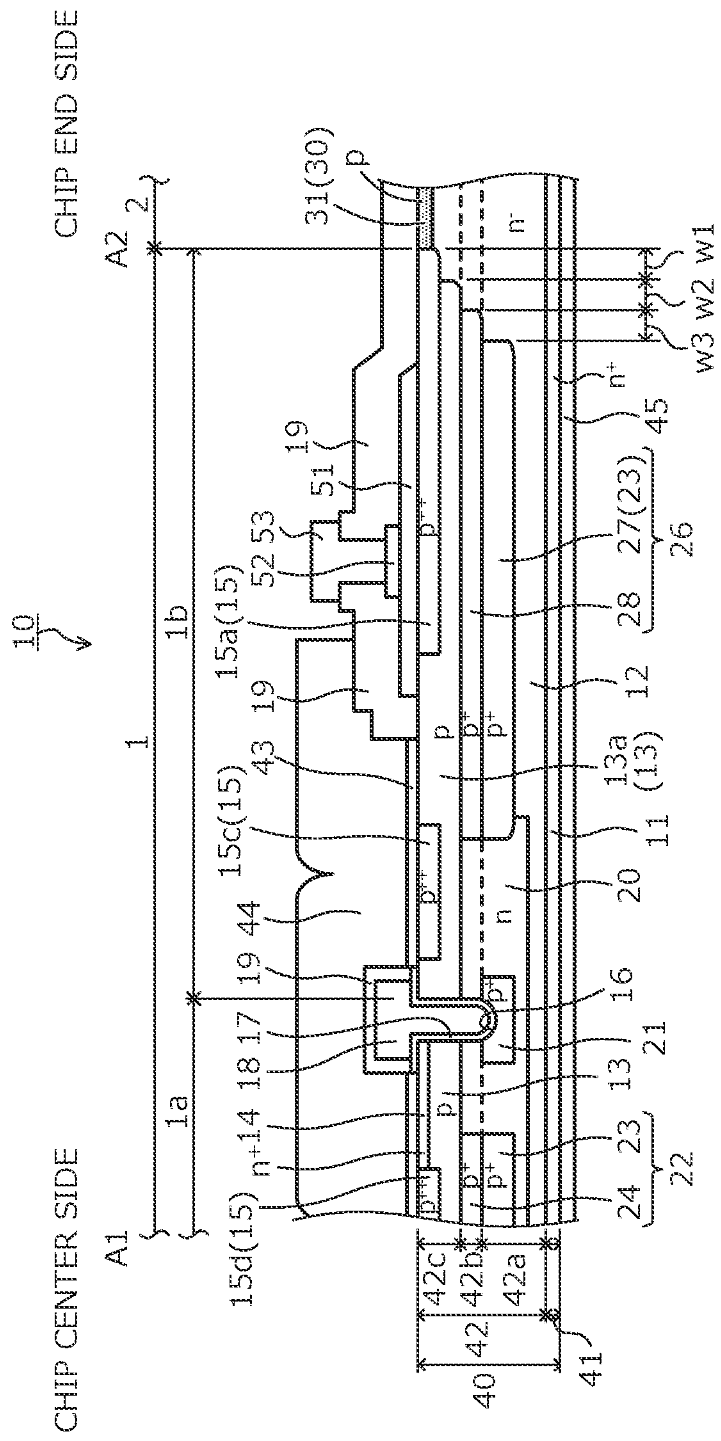
FIG. 2 is a cross-sectional view depicting a structure along cutting line A1-A2 in FIG. 1.
Figure 3:
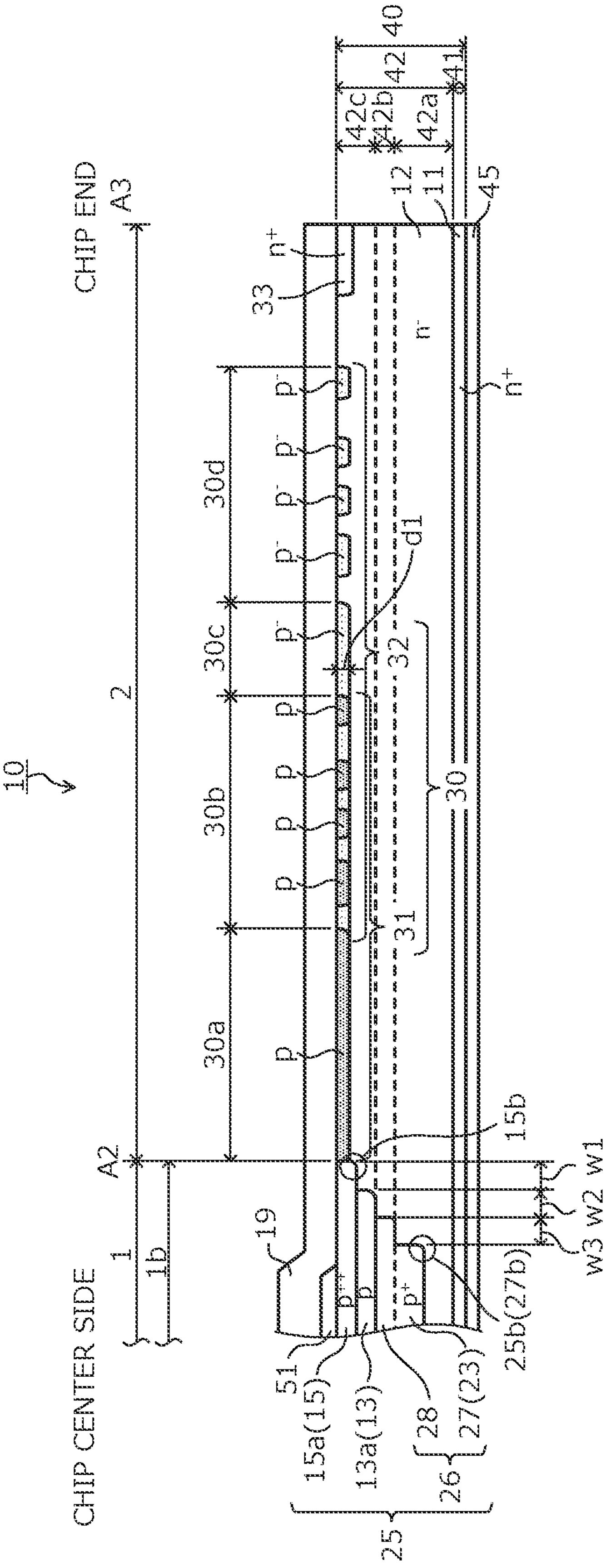
FIG. 3 is a cross-sectional view depicting the structure along cutting line A2-A3 in FIG. 1.

A structure of a silicon carbide semiconductor device according to an embodiment is described. FIG. 1 is a plan view depicting a layout when the silicon carbide semiconductor device according to the embodiment is viewed from a front side of a semiconductor substrate thereof. FIGS. 2 and 3 are cross-sectional views depicting the structure along cutting line A1-A2 and cutting line A2-A3 in FIG. 1, respectively. A silicon carbide semiconductor device 10 according to the embodiment depicted in FIGS. 1 to 3 is a vertical MOSFET with a trench gate structure that has a voltage withstanding structure 30 in an edge termination region 2 of a semiconductor substrate (semiconductor chip) 40 thereof that contains silicon carbide (SiC).

In the semiconductor substrate 40, multiple unit cells (functional units of the device) of the MOSFET, each having the same structure (device structure), are disposed adjacently to one another in a center portion 1*a* of an active region 1. The active region 1 is a region through which a main current (drift current) flows when the MOSFET is on. The active region 1 has a substantially rectangular shape in a plan view thereof and is disposed in substantially a center (chip center) of the semiconductor substrate 40. The active region 1 is a portion inward (direction to the chip center, from an end (chip end) of the semiconductor substrate 40) from an outer end of a later-described outermost (closest to the end (chip end) of the semiconductor substrate 40) $p^{++}$-type contact region 15*a*.

The edge termination region 2 is a region between the active region 1 and the chip end and has a substantially rectangular shape surrounding the periphery of the active region 1 in a plan view. The predetermined voltage withstanding structure 30 is provided in the edge termination region 2. The voltage withstanding structure 30 has a function of mitigating electric field near a border between the active region 1 and the edge termination region 2 and a function of sustaining a breakdown voltage. A configuration of the voltage withstanding structure 30 is described hereinafter. The breakdown voltage is a voltage limit at which, even when current between a drain and source increases due to avalanche breakdown occurring at pn junctions, voltage between the drain and source does not further increase.

The semiconductor substrate 40 is formed by epitaxially growing, on a front surface of an $n^+$-type starting substrate 41 containing silicon carbide, an $n^-$-type silicon carbide layer 42. The semiconductor substrate 40 has, as a front surface (first main surface), a main surface having the $n^-$-type silicon carbide layer 42 and, as a back surface (second main surface), a main surface having the $n^+$-type starting substrate 41. An entire area of the front surface of the semiconductor substrate 40 is substantially flat and no step occurs between the active region 1 and the edge termination region 2. Substantially flat means a horizontal surface within a range that includes an allowable error due to process variation.

The $n^+$-type starting substrate 41 constitutes an $n^+$-type drain region 11. The $n^-$-type silicon carbide layer 42 is formed by multistage epitaxial growth of $n^-$-type silicon carbide layers 42*a*, 42*b*, 42*c* constituting an $n^-$-type drift region (first semiconductor region) 12 and sequentially formed when regions of the active region 1 are formed. The $n^-$-type drift region 12 is a portion of the $n^-$-type silicon carbide layer 42, free of diffused regions formed by ion implantation and having an impurity concentration left unchanged after the epitaxial growth of the $n^-$-type silicon carbide layer 42. The $n^-$-type drift region 12 is in contact with the $n^+$-type starting substrate 41 and is provided spanning the active region 1 to the chip end.

The trench gate structure is configured by a p-type base region (second semiconductor region) 13, $n^+$-type source regions (third semiconductor regions) 14, $p^{++}$-type contact regions 15, trenches 16, gate insulating films 17, and gate electrodes 18. The p-type base region 13, the $n^+$-type source regions 14, and the $p^{++}$-type contact regions 15 are diffused regions formed in the uppermost silicon carbide layer 42*c* of an $n^-$-type by ion implantation. The p-type base region 13 is provided in the center portion 1*a* of the active region 1, in an entire area between the front surface of the semiconductor substrate 40 and the $n^-$-type drift region 12.

The p-type base region 13 extends outwardly toward the chip end and terminates in an outer peripheral portion 1*b* of the active region 1. A portion (hereinafter, second outer peripheral region) 13*a* of the p-type base region 13 extends in the outer peripheral portion 1*b* of the active region 1 and configures a later-described p-type outer peripheral region 25. In the active region 1, the $n^+$-type source regions 14 and the $p^{++}$-type contact region 15 are selectively provided between the front surface of the semiconductor substrate 40 and the p-type base region 13 and bottoms thereof (lower surfaces: ends facing the back surface of the semiconductor substrate 40) being in contact with the p-type base region 13.

The $n^+$-type source regions 14 are provided only between the trenches 16 that are adjacent to one another, in the center portion 1*a* of the active region 1. In the center portion 1*a* of the active region 1, $p^{++}$-type contact regions 15*d* (15) are provided between the trenches 16 that are adjacent to one another, the $p^{++}$-type contact regions 15*d* (15) being provided at positions farther from the trenches 16 than are the $n^+$-type source regions 14, the $p^{++}$-type contact regions being in contact with the $n^+$-type source regions 14. The $n^+$-type source regions 14 and the $p^{++}$-type contact regions 15*d* are in ohmic contact with later-described ohmic electrodes 43, at the front surface of the semiconductor substrate 40.

In the outer peripheral portion 1*b* of the active region 1, $p^{++}$-type contact regions 15*c* (15), 15*a* (15) are each selectively formed between the front surface of the semiconductor substrate 40 and the second outer peripheral region 13*a*, so as to surround a periphery of the center portion 1*a* of the active region 1 in concentric shapes. In the outer peripheral portion 1*b* of the active region 1, the $p^{++}$-type contact regions 15*c*, 15*a* are formed concurrently with the $p^{++}$-type contact regions 15*d* in the center portion 1*a* of the active region 1 and have an impurity concentration that is substantially a same as that of the $p^{++}$-type contact regions 15*d*. Bottoms of the $p^{++}$-type contact regions 15*d*, 15*c*, 15*a* are positioned at substantially a same depth from the front surface of the semiconductor substrate 40.

Substantially the same impurity concentration and substantially the same depth mean the same impurity concentration and the same depth within ranges that include allowable error due to process variation. Between the ohmic electrodes 43 and the p-type base region 13, the $p^{++}$-type contact regions 15*c*, may be omitted. In an instance in which the $p^{++}$-type contact regions 15*c*, are omitted, instead of the $p^{++}$-type contact regions 15*c*, 15*d*, the p-type base region 13 reaches the front surface of the semiconductor substrate 40 and is in contact with the ohmic electrodes 43.

The innermost $p^{++}$-type contact region 15*c* of the outer peripheral portion 1*b* of the active region 1 is provided in a plane of the front surface of the semiconductor substrate 40 so as to be apart from the trenches 16 and closer to the chip end than are the trenches 16 in a radial direction from the chip center to the chip end, the innermost $p^{++}$-type contact region 15*c* being in contact with the later-described ohmic electrodes 43 at the front surface of the semiconductor substrate 40. The innermost $p^{++}$-type contact region 15*c* of the outer peripheral portion 1*b* of the active region 1 faces a later-described n-type current spreading region 20 in the depth direction. The innermost $p^{++}$-type contact region 15*c* of the outer peripheral portion 1*b* of the active region 1 may face an inner end (end closest to the chip center) of a later-described $p^+$-type region 26 in the depth direction.

The outermost $p^{++}$-type contact region 15*a* of the outer peripheral portion 1*b* of the active region 1 is provided apart from the $p^{++}$-type contact region 15*c* that is closer to the chip center than is the outermost $p^{++}$-type contact region 2. The outermost $p^{++}$-type contact region 15*a* of the outer peripheral portion 1*b* of the active region 1 extends closer to the chip end than does the p-type base region 13 (i.e., the second outer peripheral region 13*a*) and is terminated by the border between the active region 1 and the edge termination region 2. The outermost $p^{++}$-type contact region (hereinafter, first outer peripheral region) of the outer peripheral portion 1*b* of the active region 1 configures the later-described p-type outer peripheral region 25.

In the center portion 1*a* of the active region 1, between the $n^-$-type drift region 12 and the p-type base region 13, the n-type current spreading region 20 and $p^+$-type regions (second-conductivity-type high-concentration regions (first and second second-conductivity-type high-concentration regions)) 21, 22 are each selectively provided at positions closer to the $n^+$-type drain region 11 (back surface of the semiconductor substrate 40) than are the bottoms of the trenches 16. The n-type current spreading region 20 and the $p^+$-type regions 21, 22 are diffused regions formed in the $n^-$-type silicon carbide layers 42*a*, 42*b*.

The n-type current spreading region 20 is a so-called current spreading layer (CSL) that reduces carrier spreading resistance. Portions of the n-type current spreading region 20 are between and in contact with the $p^+$-type regions 21, 22 that are adjacent to one another, said portions reaching the trenches 16 in a direction parallel to the front surface of the semiconductor substrate 40 and being in contact with the gate insulating films 17. The n-type current spreading region 20, at an upper surface thereof, is in contact with the p-type base region 13 while at a lower surface thereof, is in contact with the $n^-$-type drift region 12. Preferably, the n-type current spreading region 20 may reach positions closer to the $n^+$-type drain region 11 than are the $p^+$-type regions 21, 22.

The n-type current spreading region 20 extends toward the chip end, from the center portion 1*a* of the active region 1, terminates in the outer peripheral portion 1*b* of the active region 1, and surrounds an inner end of the later-described $p^+$-type region 26. The n-type current spreading region 20 may be omitted. In an instance in which the n-type current spreading region 20 is omitted, instead of the n-type current spreading region 20, portions of the $n^-$-type drift region 12 between the $p^+$-type regions 21, 22 that are adjacent to one another reach the p-type base region 13, are in contact with the p-type base region 13 and the $p^+$-type regions 21, 22, and reach the trenches 16 in a direction parallel to the front surface of the semiconductor substrate 40 to be in contact with the gate insulating films 17.

The $p^+$-type regions 21, 22 are fixed to a potential of a later-described source electrode 44 and have a function of depleting (or causing the n-type current spreading region 20 to deplete, or both) when the MOSFET (the silicon carbide semiconductor device 10) is off and, thereby, mitigating electric field applied to the gate insulating films 17. The $p^+$-type regions 21 are provided apart from the p-type base region 13 and face the bottoms of the trenches 16 in the depth direction. The $p^+$-type regions 21 are partially connected to the $p^+$-type regions 22 by a non-depicted portion and are, thereby, electrically connected to the source electrode 44.

The $p^+$-type regions 21 may be in contact with the gate insulating films 17 at the bottoms of the trenches 16 or may be apart from the bottoms of the trenches 16. A width of each of the $p^+$-type regions 21 may be the same as or wider than a width of each of the trenches 16. The width of each of the $p^+$-type regions 21 is set to be wider than the width of the trenches 16, whereby the $p^+$-type regions 21 further face corner portions (borders between the sidewalls and the bottom) of the bottoms of the trenches 16, in the depth direction. As a result, the effect of mitigating electric field near the bottoms of the trenches 16 by the $p^+$-type regions 21 increases.

Each of the $p^+$-type regions 22 is provided between an adjacent two of the trenches 16 so to be apart from the $p^+$-type regions 21 and the trenches 16. Each of the $p^+$-type regions 22, at the upper surface thereof, is in contact with the p-type base region 13. Each of the $p^+$-type regions 22 is formed by an upper portion (portion facing the $n^+$-type source regions 14) 24 formed in the $n^-$-type silicon carbide layer 42*b* and a lower portion (portion facing the $n^+$-type drain region 11) 23 formed in the $n^-$-type silicon carbide layer 42*a*, the upper portion 24 and the lower portion 23 being adjacent to each other in the depth direction.

The trenches 16 penetrate through the $n^+$-type source regions 14 and the p-type base region 13 in the depth direction and reach the n-type current spreading region 20 (in an instance in which the n-type current spreading region 20 is omitted, the $n^-$-type drift region 12). The trenches 16 may terminate in the $p^+$-type regions 21. The trenches 16, for example, extend in a striped pattern, in a direction parallel to the front surface of the semiconductor substrate 40, and reach the outer peripheral portion 1*b* of the active region 1. In the trenches 16, the gate electrodes 18 are provided, via the gate insulating films 17, respectively.

The outer peripheral portion 1*b* of the active region 1 surrounds the periphery of the center portion 1*a* of the active region 1 in a substantially rectangular shape in a plan view. In a longitudinal direction of the trenches 16, the outer peripheral portion 1*b* of the active region 1 is a portion from an outermost end of the $n^+$-type source regions 14, to the border between the active region 1 and the edge termination region 2. In a lateral direction of the trenches 16, the outer peripheral portion 1*b* of the active region 1 is a portion from an outermost sidewall of an outermost one of the trenches 16, to the border between the active region 1 and the edge termination region 2. The outer peripheral portion 1*b* of the active region 1 is free of the unit cells of the MOSFET.

In the outer peripheral portion 1*b* of the active region 1, in an entire region between the front surface of the semiconductor substrate 40 and the $n^-$-type drift region 12, the first outer peripheral region (outermost $p^{++}$-type contact region) 15*a*, the second outer peripheral region described above (extension portion of the p-type base region 13) 13*a*, and the $p^+$-type region 26 are provided adjacent to one another, sequentially in the depth direction, from the front surface of the semiconductor substrate 40. In the outer peripheral portion 1*b* of the active region 1, these regions configure a single p-type outer peripheral region (second-conductivity-type outer peripheral region) 25, in an entire area between the front surface of the semiconductor substrate 40 and the $n^-$-type drift region 12.

Further, the p-type outer peripheral region 25 is a region for leading holes out to the source electrode 44; the holes are generated by the $n^-$-type drift region 12 in the edge termination region 2 when the MOSFET (the silicon carbide semiconductor device 10) is off, and flow toward the active region 1. The hole current generated by the $n^-$-type drift region 12 in the edge termination region 2 when the MOSFET is off is lead out to the source electrode 44 via the p-type outer peripheral region 25, whereby concentration of the hole current during avalanche breakdown in the edge termination region 2 is suppressed.

Further, the p-type outer peripheral region 25 has a function of making electric field in a plane of the front surface of the semiconductor substrate 40 in the outer peripheral portion 1*b* of the active region 1 uniform. The first and second outer peripheral regions 15*a*, 13*a* are regions that are, respectively, formed concurrently with the $p^{++}$-type contact regions 15*d* of the p-type base region 13 of the center portion 1*a* of the active region 1 and that surround the periphery of the center portion 1*a* of the active region 1. The first outer peripheral region 15*a* is exposed at the front surface of the semiconductor substrate 40 and is in contact with an insulating film (insulating film in which a field oxide film 51 and an interlayer insulating film 19 are sequentially stacked) on the front surface of the semiconductor substrate 40.

The second outer peripheral region 13*a* is provided between the first outer peripheral region 15*a* and the $n^-$-type drift region 12 and is adjacent to the first outer peripheral region 15*a*, at a side of the first outer peripheral region 15*a* facing the $n^+$-type drain region 11. The $p^+$-type region 26 is provided between and in contact with the second outer peripheral region 13_a_ and the $n^-$-type drift region 12. The $p^+$-type region 26 is provided apart from the trenches 16 so as to be closer to the chip end than are the trenches 16 in the radial direction, the $p^+$-type region 26 surrounds the periphery of the center portion 1_a_ of the active region 1. All the $p^+$-type regions 21, 22 of the center portion 1_a_ of the active region 1 are connected to the $p^+$-type region 26.

The $p^+$-type region 26 is provided at substantially a same depth from the front surface of the semiconductor substrate 40 as that of the $p^+$-type regions 22 and has substantially a same thickness as that of the $p^+$-type regions 22. In other words, upper and lower surfaces of the $p^+$-type region 26 are, respectively, positioned at the same depths as those of the upper and lower surfaces of the $p^+$-type regions 22, within a range that includes allowable error due to process variation. The $p^+$-type region 26 is constituted by an upper portion (hereinafter, third outer peripheral region) 28 formed in the $n^-$-type silicon carbide layer 42_b_ and a lower portion (fourth outer peripheral region) 27 formed in the $n^-$-type silicon carbide layer 42_a_, the upper portion 28 and the lower portion 27 being adjacent to each other in the depth direction. Inner ends (ends facing the chip center) of the third and fourth outer peripheral regions 28, 27 are substantially at a same position.

The third outer peripheral region 28 is disposed at a substantially a same depth as that of the upper portions 24 of the $p^+$-type regions 22 and has substantially a same thickness as that of the $p^+$-type regions 22, the third outer peripheral region 28 is adjacent to the second outer peripheral region 13_a_, at the side of the second outer peripheral region 13_a_ facing the $n^+$-type drain region 11. In other words, an upper surface and lower surface of the third outer peripheral region 28 are, respectively, at the same depths as those of the upper and lower surfaces of the upper portions 24 of the $p^+$-type regions 22 within a range that includes allowable error due to process variation. The third outer peripheral region 28 has an impurity concentration that is lower than an impurity concentration of the upper portions 24 of the $p^+$-type regions 22. In particular, the impurity concentration of the third outer peripheral region 28 may be, for example, in a range of about 0.1 times to 0.5 times the impurity concentration of the upper portions 24 of the $p^+$-type regions 22 and, for example, may be about $1\times10^{19}/cm^3$ or less and preferably, may be as low as possible.

Figure 5:
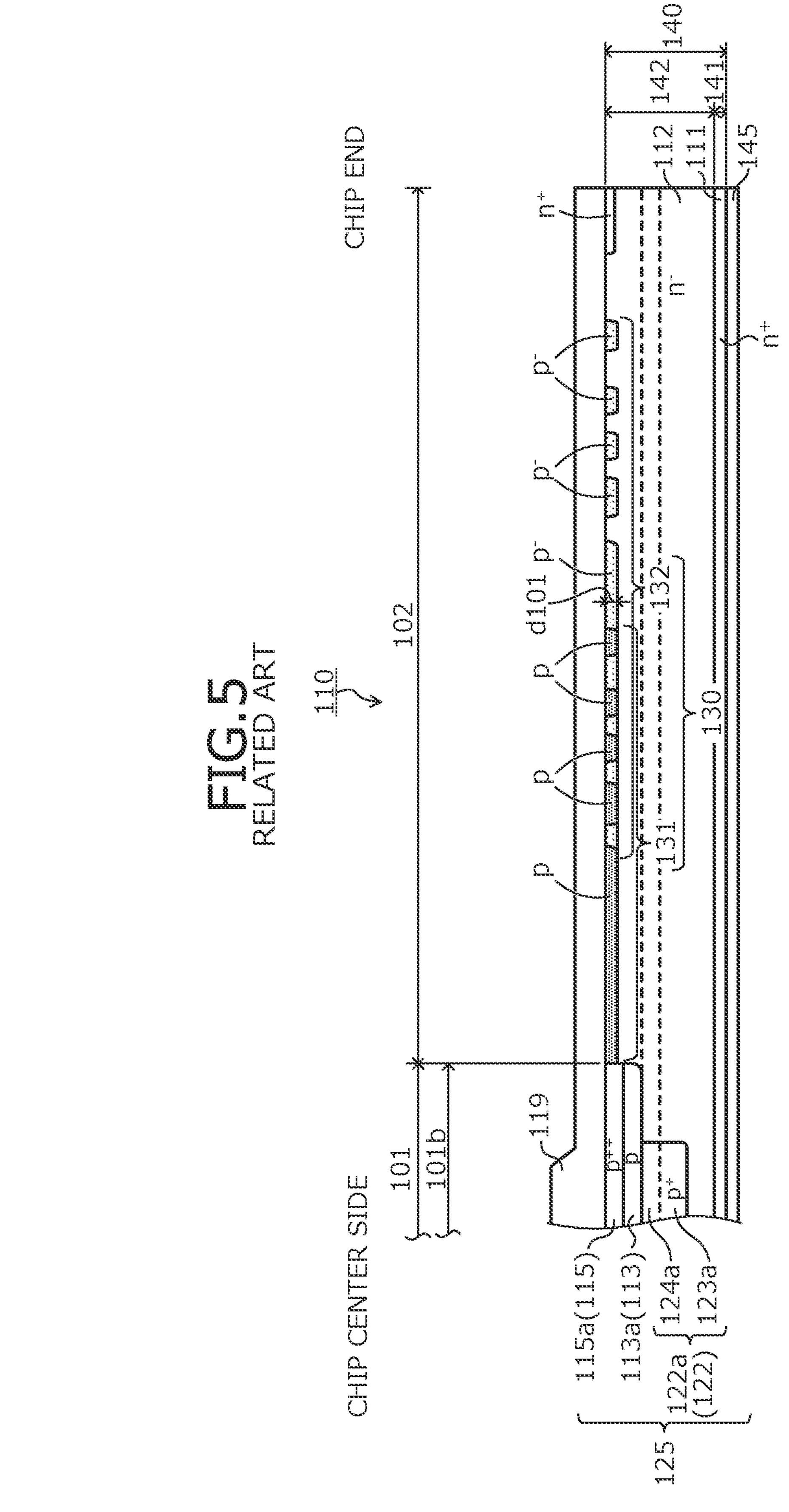
FIG. 5 RELATED ART
FIG. 5 is a cross-sectional view depicting a structure of a conventional silicon carbide semiconductor device.

Further, the impurity concentration of the third outer peripheral region 28 is lower than the impurity concentration of the third outer peripheral region 124_a_ of a conventional structure (refer to FIG. 5). In other words, the impurity concentration of the third outer peripheral region 28 is lower than the impurity concentration of the upper portions 24 of the $p^+$-type regions 22 in the center portion 1_a_ of the active region 1. For example, in an instance in which a trench gate structure similar to that of the conventional structure is disposed in the center portion 1_a_ of the active region 1, the $p^{++}$-type contact regions 15_d_, the p-type base region 13, and the $p^+$-type regions 22 of the present embodiment, respectively, have the same structure as that of the $p^{++}$-type contact regions 115, the p-type base region 113, and the $p^+$-type regions 122 of the conventional structure. The upper portions 24 of the $p^+$-type regions 22 and the third outer peripheral region 28 of the present embodiment correspond to the upper portions of the $p^+$-type regions 122 and the third outer peripheral region 124_a_ of the conventional structure, respectively, and as described above, this is because the third outer peripheral region 124_a_ and the upper portions of the $p^+$-type regions 122 of the conventional structure have the same impurity concentration.

Instead of the impurity concentration of the third outer peripheral region 28 being lower than the impurity concentration of the upper portions 24 of the $p^+$-type regions 22, the impurity concentration of the first outer peripheral region 15_a_ may be lower than the impurity concentration of the $p^{++}$-type contact regions 15_d_ of the center portion 1_a_ of the active region 1. In this instance, the impurity concentration of the first outer peripheral regions 15 may be in a range of, for example, 0.1 times to 0.5 times the impurity concentration of the $p^{++}$-type contact regions 15_d_ and, for example, is about $1\times10^{19}$/cm 3 or less. The impurity concentration of the third outer peripheral region 28 may be the same as the impurity concentration of the upper portions 24 of the $p^+$-type regions 22. In this instance as well, effects similar to those in an instance in which the impurity concentration of the third outer peripheral region 28 is lower than the impurity concentration of the upper portions 24 of the $p^+$-type regions 22 are obtained. Further, the impurity concentration of the third outer peripheral region 28 and the impurity concentration of the first outer peripheral region 15_a_ may be lower than the impurity concentrations of corresponding regions of the center portion 1_a_ of the active region 1.

The fourth outer peripheral region 27 is in contact with the third outer peripheral region 28, at a side of the third outer peripheral region 28 facing the $n^+$-type drain region 11. The fourth outer peripheral region 27 is disposed closest to the $n^+$-type drain region 11, among the multiple p-type regions configuring the p-type outer peripheral region 25. The fourth outer peripheral region 27 is a region formed concurrently with lower portions 23 of the $p^+$-type regions 22, the fourth outer peripheral region 27 being provided at substantially the same depth as that of the lower portions 23 of the $p^+$-type regions 22 and having substantially the same thickness and substantially the same impurity concentration as that of the lower portions 23 of the $p^+$-type regions 22. In other words, the upper surface and the lower surface of the fourth outer peripheral region 27 are, respectively, at the same depths as the depths of the upper surface and the lower surface of each of the lower portions 23 of the $p^+$-type regions 22 within a range that includes allowable error due to process variation.

Outer ends of the first outer peripheral region 15_a_, the second outer peripheral region 13_a_, the third outer peripheral region 28, and the fourth outer peripheral region 27 terminate at different positions from one another. In particular, the outer end of the first outer peripheral region 15_a_ is positioned at the border between the active region 1 and the edge termination region 2. The outer end of the second outer peripheral region 13_a_ terminates a predetermined amount (hereinafter, width) w1 closer to the chip center than does the outer end of the first outer peripheral region 15_a_. The outer end of the third outer peripheral region 28 terminates a predetermined amount (hereinafter, width) w2 closer to the chip center than does the outer end of the second outer peripheral region 13_a_. The outer end of the fourth outer peripheral region 27 terminates a predetermined amount (hereinafter, width) w3 closer to the chip center than does the outer end of the third outer peripheral region 28.

As a result, of the first outer peripheral region 15_a_, the second outer peripheral region 13_a_, the third outer peripheral region 28, and the fourth outer peripheral region 27 configuring the p-type outer peripheral region 25, the first outer peripheral region 15_a_, which is closest to the front surface of the semiconductor substrate 40, extends closest to the chip end. At the outer end of the p-type outer peripheral region 25, multiple steps are formed that are recessed stepwise toward the chip center by the widths w1, w2, w3

(which are the same) and thereby, in the depth direction from the front surface of the semiconductor substrate 40, are arranged in ascending order of the proximity thereof to the chip center. The widths w1, w2, w3 of the steps of the outer end of the p-type outer peripheral region 25 are all the same width (w1=w2=w3).

Preferably, the widths w1, w2, w3 of the steps of the outer end of the p-type outer peripheral region 25 may be, for example, about 1 μm or more, and may be as wide as possible. Further, the widths w1, w2, w3 of the steps of the outer end of the p-type outer peripheral region 25 may be, for example, in a range of about 2 μm to 4 μm. The widths w1, w2, w3 of the steps of the outer end of the p-type outer peripheral region 25 are, respectively, a width in the radial direction from the outer end of the first outer peripheral region 15*a* to the outer end of the second outer peripheral region 13*a*, a width in the radial direction from the outer end of the second outer peripheral region 13*a* to the outer end of the third outer peripheral region 28, and a width in the radial direction from the outer end of the third outer peripheral region 28 to the outer end of the fourth outer peripheral region 27.

In this manner, steps are formed at the outer end of the p-type outer peripheral region 25, whereby when the MOSFET is off, while an outer corner portion 15*b* of the bottom of the first outer peripheral region 15*a* is a location of electric field concentration, electric field concentration at the outer corner portion 15*b* is mitigated by the voltage withstanding structure 30, which is adjacent to the first outer peripheral region 15*a* and closer to the chip end than is the first outer peripheral region 15*a*. Further, the second outer peripheral region 13*a*, the third outer peripheral region 28, and the fourth outer peripheral region 27 each terminates closer to the chip center than is the outer end of the p-type region directly above (direction to the front surface of the semiconductor substrate 40) and adjacent thereto and thus, local concentration of electric field at the outer corner portions of the bottoms of these regions is suppressed.

The interlayer insulating film 19 is provided in an entire area of the front surface of the semiconductor substrate 40 and covers the gate electrodes 18 and a gate polysilicon wiring layer 52. In the outer peripheral portion 1*b* of the active region 1 and the edge termination region 2, the field oxide film 51 is provided between the front surface of the semiconductor substrate 40 and the interlayer insulating film 19. The gate polysilicon wiring layer 52 is disposed between the field oxide film 51 and the interlayer insulating film 19, in the outer peripheral portion 1*b* of the active region 1. The gate polysilicon wiring layer 52 surrounds the periphery of the center portion 1*a* of the active region 1.

A gate metal wiring layer 53 is provided on the gate polysilicon wiring layer 52, via a contact hole of the interlayer insulating film 19. The gate polysilicon wiring layer 52 and the gate metal wiring layer 53 configure a gate runner. The gate electrodes 18 are connected to the gate polysilicon wiring layer 52, at the ends of the trenches 16 in the longitudinal direction thereof. All the gate electrodes 18 are electrically connected to a gate pad (electrode pad: not depicted) via the gate polysilicon wiring layer 52 and the gate metal wiring layer 53.

Preferably the structure may be the same directly beneath (direction to the $n^+$-type drain region 11) the gate runner; and directly beneath the gate runner, the p-type outer peripheral region 25 alone is provided between the front surface of the semiconductor substrate 40 and the $n^-$-type drift region 12. In other words, an entire surface of the gate runner faces the first outer peripheral region 15*a*, the second outer peripheral region 13*a*, the third outer peripheral region 28, and the fourth outer peripheral region 27, in the depth direction via the field oxide film 51. An inner end of the gate runner is positioned closer to the chip end than is the inner end of the first outer peripheral region 15*a*. An outer end of the gate runner is positioned closer to the chip center than is the outer end of the fourth outer peripheral region 27.

Ohmic electrodes (first electrodes) 43 are provided on portions of the front surface of the semiconductor substrate 40, exposed by contact holes of the interlayer insulating film 19. At the front surface of the semiconductor substrate 40, the ohmic electrodes 43 are in ohmic contact with the $n^+$-type source regions 14 and the $p^{++}$-type contact regions 15*d*, 15*c* (in an instance in which the $p^{++}$-type contact regions 15*d*, 15*c* are omitted, the p-type base region 13). The ohmic electrodes 43, for example, are a nickel silicide (NixSiy, where, x and y are arbitrary integers) films.

The source electrode (first electrode) 44, is provided on the interlayer insulating film 19 so as to be embedded in the contact holes of the interlayer insulating film 19. The source electrode 44 is provided in an entire area of the center portion 1*a* of the active region 1 and extends in the outer peripheral portion 1*b* of the active region 1 but does not reach the gate metal wiring layer 53. The source electrode 44 is electrically connected to the $n^+$-type source regions 14, the $p^{++}$-type contact regions 15*d*, the p-type base region 13, and the $p^+$-type regions 21, 22 via the ohmic electrodes 43, in the center portion 1*a* of the active region 1.

The source electrode 44 is electrically connected to the $p^{++}$-type contact region 15*c*, the first outer peripheral region 15*a*, the second outer peripheral region 13*a*, the third outer peripheral region 28, and the fourth outer peripheral region 27 via the ohmic electrodes 43, in the outer peripheral portion 1*b* of the active region 1. A drain electrode (second electrode) 45 is provided in an entire area of the back surface (back surface of the $n^+$-type starting substrate 41) of the semiconductor substrate 40, is in ohmic contact with the $n^+$-type drain region 11 (the $n^+$-type starting substrate 41), and is electrically connected to the $n^+$-type drain region 11.

The voltage withstanding structure 30 of the edge termination region 2 is a spatial modulation JTE structure having, for example, a JTE structure as a spatial modulation structure, and is configured by p-type regions (second-conductivity-type voltage withstanding regions) 31 and $p^-$-type regions (second-conductivity-type voltage withstanding regions) 32 provided between the front surface of the semiconductor substrate 40 and the $n^-$-type drift region 12. The p-type regions 31 and the $p^-$-type regions 32 are diffused regions formed in the $n^-$-type silicon carbide layer 42*c*, at the surface thereof, by ion implantation, and all of these regions have substantially a same depth dl of, for example, about 0.5 μm from the front surface of the semiconductor substrate 40.

Depths of the bottoms of the p-type regions 31 and the $p^-$-type regions 32 are shallower from the front surface of the semiconductor substrate 40 than is a depth of the bottom of the first outer peripheral region 15*a*. Thus, the outer corner portions of the bottoms of the first outer peripheral region 15*a*, the second outer peripheral region 13*a*, the third outer peripheral region 28, and the fourth outer peripheral region 27 are surrounded by the $n^-$-type drift region 12. The p-type regions 31 and the $p^-$-type regions 32 are in contact with the insulating film (the interlayer insulating film 19 and the field oxide film 51) on the front surface of the semiconductor substrate 40.

The p-type regions 31 are disposed apart from one another in concentric shapes surrounding the periphery of the active region 1. The p-type regions 31 are disposed in descending order of width (width in the radial direction, which is a direction from the chip center to the chip end, in a plan view (in a plane of the front surface of the semiconductor substrate 40) and an interval between any one of the p-type regions 31 and an adjacent one of the p-type regions 31 (the adjacent one closer to the chip center) is wide. An innermost one of the p-type regions 31 is disposed adjacent to the first outer peripheral region 15*a*, closer to the chip end than is the first outer peripheral region 15*a*. In FIGS. 2 and 3, the p-type regions 31 and the $p^-$-type regions 32 are indicated by different hatching.

The $p^-$-type regions 32 are disposed apart from one another in concentric shapes surrounding the periphery of the active region 1. The $p^-$-type regions 32 are disposed in descending order of width (width in the radial direction) in the radial direction and an interval between any one of the $p^-$-type regions 32 and an adjacent one of the $p^-$-type regions 32 (the adjacent one of the $p^-$-type regions 32 closer to the chip center) is wide. A width of an outermost of the $p^-$-type regions 32 may be wider than the width of the adjacent one (closer to the chip center) of the $p^-$-type regions 32. A number of the $p^-$-type regions 32 relatively close to the chip center are disposed between the p-type regions 31 that are adjacent to one another, whereby the $p^-$-type regions 32 relatively close to the chip center are adjacent to the p-type regions 31 on both sides thereof in the radial direction and corner portions of the bottoms of all the p-type regions 31 are surrounded.

An inner end of the innermost one the $p^-$-type regions 32 terminates at the same position as the outer end of the innermost one of the p-type regions 31 or terminates closer to the chip end than is the outer end of the innermost one of the p-type regions 31. The innermost one of the $p^-$-type regions 32 extends closer to the chip center than is the outermost one of the p-type regions 31. The $p^-$-type regions 32 excluding the $p^-$-type regions 32 relatively close to the chip center are disposed closer to the chip end than are the p-type regions 31. Portions of the $n^-$-type drift region 12 extend between all the $p^-$-type regions 32 that are adjacent to one another, the portions reaching the front surface of the semiconductor substrate 40 and being adjacent to the $p^-$-type regions 32 on both sides thereof in the radial direction.

All the p-type regions 31 and a number of the $p^-$-type regions 32 relatively close to the chip center are fixed to the potential of the source electrode 44 via the first outer peripheral region 15*a*. Electric field strength of the edge termination region 2 tends to decrease in a direction from the active region 1 to the chip end. Therefore, corresponding to the trend of the electric field strength distribution of the edge termination region 2, JTE regions 30*a*, 30*c* are disposed in descending order of impurity concentration thereof, in a direction from the active region 1 to the chip end, whereby a predetermined breakdown voltage of the edge termination region 2 is stably maintained.

An innermost one of the p-type regions 31 (JTE region 30*a*) and a portion (JTE region) 30*c* of one of the $p^-$-type regions 32 (the portion thereof being in contact with an outer end of an outermost one of the p-type regions 31) configure a double-zone JTE structure. The p-type regions 31 excluding the JTE region 30*a* and a number of the $p^-$-type regions 32 that are relatively close to the chip center configure a spatial modulation region 30*b* between the JTE regions 30*a*, 30*c*. A spatial modulation region 30*d* that is adjacent to the JTE region 30*c* and closer to the chip end than is the JTE region 30*c* is configured by the $p^-$-type regions 32 excluding the innermost one of the $p^-$-type regions 32 and the $n^-$-type drift region 12.

The spatial modulation region 30*b* is formed by disposing two sub-regions (the p-type regions 31 and the $p^-$-type regions 32) adjacent to each other so as to repeatedly alternate with one another in a predetermined pattern, the two sub-regions respectively having the substantially same impurity concentrations as those of the regions (the JTE regions 30*a*, 30*c*) respectively adjacent on opposite sides of the spatial modulation region 30*b* in the radial direction. The spatial modulation region 30*d* is formed by disposing two sub-regions (the $p^-$-type regions 32 and the $n^-$-type drift region 12) adjacent to each other so as to repeatedly alternate with one another in a predetermined pattern, the two sub-regions respectively having substantially the same impurity concentrations as those of the regions (the JTE region 30*c* and the $n^-$-type drift region 12) respectively adjacent on opposite sides of the spatial modulation region 30*d* in the radial direction. Overall spatial impurity concentration distributions of the spatial modulation regions 30*b*, 30*d* are determined by the widths and impurity concentration ratios.

As described, the voltage withstanding structure 30 has the JTE regions 30*c* and the spatial modulation regions 30*b*, 30*d*. In this instance, the voltage withstanding structure 30 is a spatial modulation JTE structure that has the spatial modulation region 30*b* disposed between the JTE regions 30*a*, 30*c*, which are adjacent to each other, the spatial modulation region 30*b* having an impurity concentration distribution that is spatially equivalent to an intermediate impurity concentration of the impurity concentrations of these two regions (the JTE regions 30*a*, 30*c*), the spatial modulation JTE structure further having between the JTE region 30*c* and a portion of the $n^-$-type drift region 12 closer to the chip end than is the JTE region 30*c*, the spatial modulation region 30*d*, which has an impurity concentration distribution that is spatially equivalent to an intermediate impurity concentration of the impurity concentrations of these two regions (the JTE region 30*c* and the portion of the $n^-$-type drift region 12), and thus, the voltage withstanding structure 30 overall has a p-type impurity concentration that gradually decreases in a direction from the chip center to the chip end.

The voltage withstanding structure 30 may be a single-zone JTE structure configured by only a single JTE region (not depicted). In this instance, the voltage withstanding structure 30 is a spatial modulation JTE structure that has a spatial modulation region disposed between the one JTE region and the portion of the $n^-$-type drift region closer to the chip end than is the one JTE region, the spatial modulation region having an impurity concentration distribution that is spatially equivalent to an intermediate impurity concentration of the impurity concentrations of these two regions (the one JTE region and the portion of the $n^-$-type drift region) and thus, the voltage withstanding structure 30 overall has a p-type impurity concentration that gradually decreases in a direction from the chip center to the chip end. The spatial modulation JTE structure may stably ensure a predetermined breakdown voltage of the edge termination region 2 as compared to a general JTE structure without a spatial modulation region.

Further, between the front surface of the semiconductor substrate 40 and the $n^-$-type drift region 12, an $n^+$-type channel stopper region 33 is selectively provided closer to the chip end than is the voltage withstanding structure 30. The $n^+$-type channel stopper region 33 is a diffused region formed by ion implantation in the $n^-$-type silicon carbide layer 42$c$, at the surface thereof. The $n^+$-type channel stopper region 33 is provided apart from the voltage withstanding structure 30 and closer to the chip end in the radial direction than is the voltage withstanding structure 30; the $n^+$-type channel stopper region 33 surrounds a periphery of the voltage withstanding structure 30. The $n^+$-type channel stopper region 33 is in contact with the insulating film on the front surface of the semiconductor substrate 40.

The $n^+$-type channel stopper region 33 is exposed at the chip end. Between the $n^+$-type channel stopper region 33 and the voltage withstanding structure 30 (the outermost one of the $p^-$-type regions 32) is the $n^-$-type drift region 12. The $n^+$-type channel stopper region 33 has a floating potential. In the edge termination region 2, the front surface of the semiconductor substrate is free of a field plate (FP) and a channel stopper electrode. Instead of the $n^+$-type channel stopper region 33, a $p^+$-type channel stopper region may be provided.

Operation of the silicon carbide semiconductor device 10 according to the embodiment is described. When voltage that is at least equal to a gate threshold voltage is applied to the gate electrodes 18 while voltage (forward voltage) that is positive with respect to the source electrode 44 is applied to the drain electrode 45, a channel (n-type inversion layer) is formed in portions of the p-type base region 13, along the trenches 16. As a result, current flows from the $n^+$-type drain region 11, through the $n^-$-type drift region 12 and the channels to the $n^+$-type source regions 14, whereby the MOSFET (the silicon carbide semiconductor device 10) turns on.

On the other hand, when voltage lower than the gate threshold voltage is applied to the gate electrodes 18 while forward voltage is applied between a source and drain, pn junctions (main junctions of the active region 1) between the p-type base region 13, the $p^+$-type regions 21, 22 and the p-type outer peripheral region 25, the n-type current spreading region 20 and the $n^-$-type drift region 12 are reverse biased, whereby the MOSFET maintains an off state. At this time, a depletion layer spreads in the $n^-$-type drift region 12, from the pn junctions, whereby electric field applied to the gate insulating films 17 at the bottoms of the trenches 16 is mitigated.

Further, a predetermined breakdown voltage based on dielectric field strength of silicon carbide and a width (width in the radial direction) of the depletion layer is ensured relative to an extent that the depletion layer spreads outward (direction to the chip end) in the $n^-$-type drift region 12 of the edge termination region 2, when the MOSFET is off. Further, when the MOSFET is off, electric field concentrates at the outer corner portion 15$b$ of the bottom of the first outer peripheral region 15$a$, which is closest to the front surface of the semiconductor substrate 40, among the first to fourth outer peripheral regions 13$a$, 28, 27 configuring the p-type outer peripheral region 25.

Thus, local concentration of electric field at an outermost peripheral end (hereinafter, main junction end) of a main junction of the active region 1 may be suppressed. The main junction end of the active region 1 is an outer corner portion 25$b$ (an outer corner portion 27$b$ of the bottom of the fourth outer peripheral region 27 that is closest to the back surface of the semiconductor substrate 40, among the first to fourth outer peripheral regions 15$a$, 13$a$, 28, 27 configuring the p-type outer peripheral region 25) of the bottom of the p-type outer peripheral region 25. Electric field concentration at the outer corner portion 15$b$ of the bottom of the first outer peripheral region 15$a$ is mitigated by the voltage withstanding structure 30, which is adjacent to the first outer peripheral region 15$a$ and closer to the chip end than is the first outer peripheral region 15$a$.

Further, at the outer end of the p-type outer peripheral region 25, steps are formed at multiple depths, the steps being recessed stepwise toward the chip center by the equal widths w1, w2, w3 and thereby, in the depth direction from the front surface of the semiconductor substrate 40, are arranged in ascending order of the proximity thereof to the chip center; and the impurity concentration of the third outer peripheral region 28 configuring the p-type outer peripheral region 25 is lower than the impurity concentration of the upper portions 24 of the $p^+$-type regions 22 in the center portion 1$a$ of the active region 1, whereby when the MOSFET is off, electric field applied to lower portions (the third and fourth outer peripheral regions 28, 27) and outer ends (step portions) of the p-type outer peripheral region 25 may be mitigated and thus, decreases in the breakdown voltage in the edge termination region 2 are suppressed.

Next, a method of manufacturing the silicon carbide semiconductor device 10 according to the embodiment is described. First, on the front surface of the $n^+$-type starting substrate ($n^+$-type starting wafer) 41, which constitutes the $n^+$-type drain region 11, the $n^-$-type silicon carbide layer 42$a$, which constitutes the $n^-$-type drift region 12, is epitaxially grown. Next, in the center portion 1$a$ of the active region 1, in the $n^-$-type silicon carbide layer 42$a$, at the surface thereof, the $p^+$-type regions 21, the lower portions 23 of the $p^+$-type regions 22, and the fourth outer peripheral region 27 are concurrently formed selectively by photolithography and ion implantation of a p-type impurity. Further, in the active region 1, in the $n^-$-type silicon carbide layer 42$a$, at the surface thereof, the lower portion of the n-type current spreading region 20 is formed by photolithography and ion implantation of an n-type impurity. A sequence in which the $p^+$-type regions 21, the lower portions 23 of the $p^+$-type regions 22, the fourth outer peripheral region 27, and the lower portion of the n-type current spreading region 20 are formed may be interchanged. The fourth outer peripheral region 27 may be formed at a timing different from that of the $p^+$-type regions 21 and the lower portions 23 of the $p^+$-type regions 22.

Next, the $n^-$-type silicon carbide layer 42$b$ constituting the $n^-$-type drift region 12 is epitaxially grown on the $n^-$-type silicon carbide layer 42$a$. Next, the upper portions 24 of the $p^+$-type regions 22 are selectively formed in the $n^-$-type silicon carbide layer 42$b$ in the center portion 1$a$ of the active region 1 by photolithography and ion implantation of a p-type impurity. At this time, the upper portions 24 and the lower portions 23 of the $p^+$-type regions 22 are connected in the depth direction.

Further, the third outer peripheral region 28 is formed in the $n^-$-type silicon carbide layer 42$b$, in the outer peripheral portion 1$b$ of the active region 1 by photolithography and ion implantation of a p-type impurity; an impurity concentration of the third outer peripheral region 28 being lower than the impurity concentration of the upper portions 24 of the $p^+$-type regions 22. At this time, the third and fourth outer peripheral regions 28, 27 are connected to each other in the depth direction, whereby the $p^+$-type region 26 is formed. The outer end of the third outer peripheral region 28 terminates closer to the chip end than does the outer end of the fourth outer peripheral region 27.

Further, the upper portion of the n-type current spreading region 20 is formed in the $n^-$-type silicon carbide layer 42$b$, in the active region 1 by photolithography and ion implantation of an n-type impurity. At this time, the upper portion and the lower portion of the n-type current spreading region 20 are connected. A sequence in which the upper portions 24 of the p$^+$-type regions 22, the third outer peripheral region 28, and the upper portion of the n-type current spreading region 20 are formed may be interchanged.

Next, on the n$^-$-type silicon carbide layer 42*b*, the n$^-$-type silicon carbide layer 42*c* constituting the n$^-$-type drift region 12 is formed by epitaxial growth. By the processes up to here, the semiconductor substrate (semiconductor wafer) 40 having a predetermined thickness and in which the n$^-$-type silicon carbide layer 42 (42*a* to 42*c*) having therein the p$^+$-type regions 21, 22, 26, and the n-type current spreading region 20 are stacked on the n$^+$-type starting substrate 41 is completed.

Next, the p-type base region 13 and the second outer peripheral region 13*a* are concurrently formed in the n$^-$-type silicon carbide layer 42*c* in the active region 1 by photolithography and ion implantation of a p-type impurity. At this time, the p-type base region 13 and the upper portions 24 of the p$^+$-type regions 22 are connected in the depth direction. The second and third outer peripheral regions 13*a*, 28 are connected in the depth direction. The outer end of the second outer peripheral region 13*a* is terminated closer to the chip end than is the outer end of the third outer peripheral region 28.

Further, in the center portion 1*a* of the active region 1, in the n$^-$-type silicon carbide layer 42*c*, at the surface thereof, the n$^+$-type source regions 14 are selectively formed by photolithography and ion implantation of an n-type impurity. Further, by photolithography and ion implantation of a p-type impurity, in the active region 1, in the n$^-$-type silicon carbide layer 42*c*, at the surface thereof, the p$^{++}$-type contact regions 15*d*, 15*c* and the first outer peripheral region 15*a* are selectively formed concurrently.

At this time, the n$^+$-type source regions 14 and the p$^{++}$-type contact regions 15*d* are put in contact with the p-type base region 13, in the depth direction. The p$^{++}$-type contact region 15*c* is put in contact with the second outer peripheral region 13*a* in the depth direction. Further, the first and second outer peripheral regions 15*a*, 13*a* are connected to each other in the depth direction. As a result, the first to fourth outer peripheral regions 15*a*, 13*a*, 28, 27 are connected to one another in the depth direction, whereby the p-type outer peripheral region 25 is formed in the outer peripheral portion 1*b* of the active region 1.

The outer end of the first outer peripheral region 15*a* terminates closer to the chip end than does the outer end of the second outer peripheral region 13*a*. As a result, the farther each of the first to fourth outer peripheral regions 15*a*, 13*a*, 28, 27 is from the front surface of the semiconductor substrate 40, the closer the outer end thereof terminates to the chip center. At the outer end of the p-type outer peripheral region 25, the steps are formed at multiple depths, the steps being recessed stepwise toward the chip center by the equal widths w1, w2, w3 and thereby, in the depth direction from the front surface of the semiconductor substrate 40 (surface of the n$^-$-type silicon carbide layer 42*c*), are arranged in ascending order of the proximity thereof to the chip center.

Further, in the edge termination region 2, in the n$^-$-type silicon carbide layer 42*c*, at the surface thereof, the p-type regions 31 and the p$^-$-type regions 32 are each selectively formed by photolithography and ion implantation of a p-type impurity. The p-type regions 31 and the p$^-$-type regions 32 are formed at different timings from each other. Further, by photolithography and ion implantation of an n-type impurity, in the edge termination region 2, in the n$^-$-type silicon carbide layer 42*c*, at the surface thereof, the n$^+$-type channel stopper region 33 is selectively formed.

The p-type regions 31 and the p$^-$-type regions 32 form the voltage withstanding structure 30 in the edge termination region 2. A sequence in which diffused regions are formed in the n$^-$-type silicon carbide layer 42*c* may be suitably changed. The n$^+$-type channel stopper region 33 may be formed concurrently with the n$^+$-type source regions 14. A portion of the n$^-$-type silicon carbide layer 42 (42*a* to 42*c*) remaining free of ion implantation and having the same impurity concentration as that at the time of epitaxial growth thereof constitutes the n$^-$-type drift region 12.

Next, a heat treatment for activating the impurities ion-implanted in the n$^-$-type silicon carbide layer 42 is performed. The heat treatment for activating these impurities may be performed each time the impurities are ion-implanted in the n$^-$-type silicon carbide layers 42*a* to 42*c*. Next, by a general method, the trenches 16, the gate insulating films 17, the gate electrodes 18, the field oxide film 51, and the gate polysilicon wiring layer 52 are formed.

Next, on an entire area of the front surface of the semiconductor substrate 40, the interlayer insulating film 19 is formed. Next, by a general method, the source electrode 44, the gate pad (not depicted), the gate metal wiring layer 53, a passivation film (surface protecting film, not depicted) and the drain electrode 45 are formed. A portion of the source electrode 44 exposed in an opening of the passivation film constitutes a source pad. Thereafter, the semiconductor wafer is diced (cut) into individual chips, whereby the silicon carbide semiconductor device 10 in FIGS. 1 to 3 is completed.

As described above, according to the first embodiment, at the outer end of the p-type outer peripheral region of the outer peripheral portion of the active region, steps are formed that are recessed stepwise toward the chip center and thereby, in the depth direction from the front surface of the semiconductor substrate, are arranged in ascending order of proximity thereof to the chip center. Thus, of the first to fourth outer peripheral regions configuring the p-type outer peripheral region, the outer corner portion of the bottom of the first outer peripheral region that is disposed closest to the front surface of the semiconductor substrate and that terminates closest to the chip end is a location where electric field concentrates when the MOSFET is off, however, concentration of electric field at the outer corner portion of the bottom thereof is mitigated by the voltage withstanding structure, which is provided closer to the chip end than is the first outer peripheral region.

Further, according to the embodiment, the impurity concentration of the third outer peripheral region is lower than the impurity concentration of the upper portion of each of the p$^+$-type regions for mitigating electric field applied to the gate insulating films at the bottoms of the trenches in the center portion of the active region and the widths of the steps at the outer end of the p-type outer peripheral region are all the same width. As a result, the impurity concentration of the third outer peripheral region and the position of each of the outer ends of the first to fourth outer peripheral regions may be optimized and thus, electric field applied to the lower portions of (the third and fourth outer peripheral regions) and the outer ends (step portions) of the p-type outer peripheral region may be mitigated.

Electric field applied to the lower portions and the outer ends of the p-type outer peripheral region may be mitigated and thus, concentration of electric field at the main junction end (outer corner portion of the bottom of the p-type outer peripheral region) of the active region is suppressed, whereby avalanche breakdown capability at the main junction end of the active region may be enhanced. As a result, decreases in the breakdown voltage of the edge termination region may be suppressed and the breakdown voltage of the edge termination region may be suppressed from becoming lower than the breakdown voltage of the active region. Thus, the breakdown voltage of the silicon carbide semiconductor device overall may be determined by the breakdown voltage of the active region and reliability may be enhanced.

Further, according to the embodiment, ion implantation mask patterns are suitably changed, whereby the steps may be formed at the outer end of the p-type outer peripheral region without changing the method of forming the device structure of the active region. Further, the third outer peripheral region is formed at a timing different from that of regions of the active region and thus, the impurity concentration of the third outer peripheral region may be suitably set without changing the method of forming the device structure of the active region. Thus, a reliable silicon carbide semiconductor device that is easy to form and stably ensures a predetermined breakdown voltage may be provided.

Figure 4:
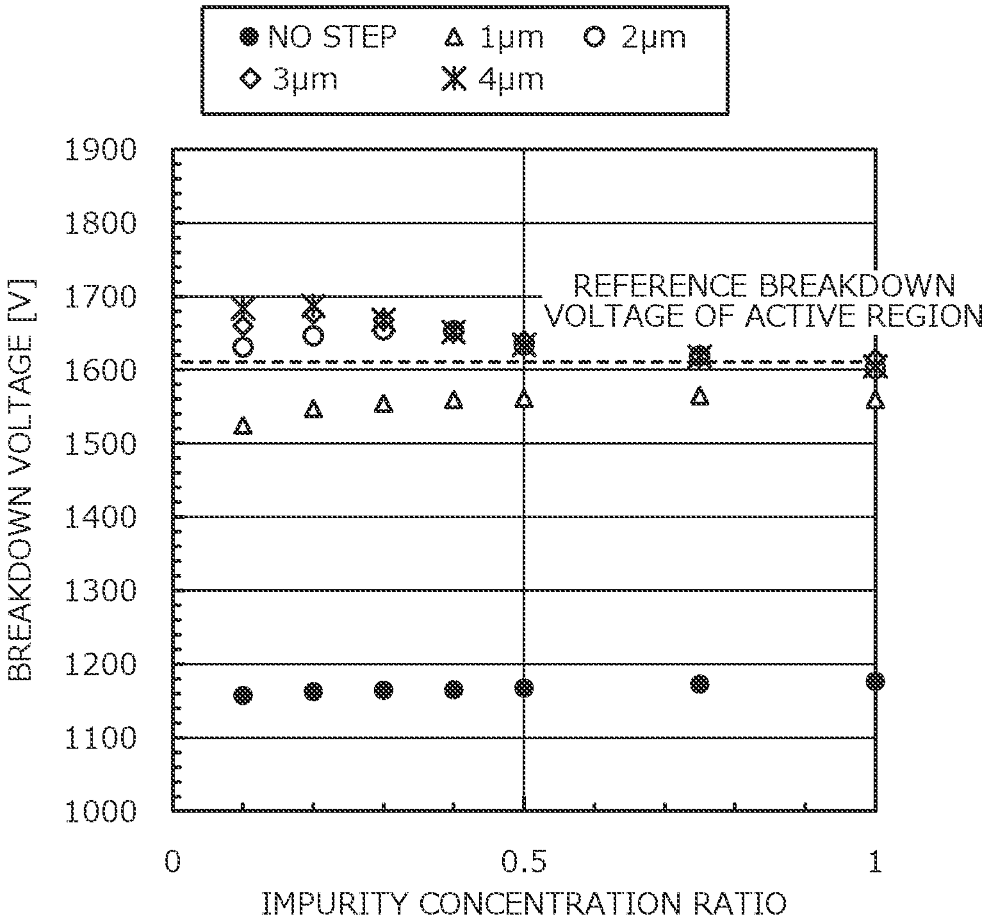
FIG. 4 is a characteristics diagram showing results of simulation of breakdown voltage characteristics an experimental example.

Breakdown voltage characteristics of the silicon carbide semiconductor device 10 (hereinafter, experimental example: refer to FIGS. 1 to 3) according to the embodiment described above were verified. FIG. 4 is a characteristics diagram showing results of simulation of breakdown voltage characteristics the experimental example. In FIG. 4, a horizontal axis indicates the ratio (hereinafter, ratio of the impurity concentration of the third outer peripheral region 28) of the impurity concentration of the third outer peripheral region 28 to the impurity concentration of the upper portions 24 of the $p^+$-type regions 22, and a vertical axis indicates the breakdown voltage of the edge termination region 2.

Results of simulating the breakdown voltage of the edge termination region 2 of the experimental example by variously changing the widths w1, w2, w3 (width w1=width w2=width w3) of the steps of the outer end of the p-type outer peripheral region 25 and the impurity concentration of the third outer peripheral region 28 are shown in FIG. 4. FIG. 4 shows the results of four experimental examples of simulation in which the widths w1, w2, w3 (width w1=width w2=width w3) of the outer end of the p-type outer peripheral region 25 were assumed to be 1 μm, 2 μm, 3 μm, and 4 μm.

Further, in FIG. 4, for comparison, simulation results for the breakdown voltage of the edge termination region 2 of a comparison example indicated as "no step" are shown. The comparison example differs from the experimental example in that each of the outer ends of the first to fourth outer peripheral regions configuring the p-type outer peripheral region 25 terminate at the same position and are in a same plane orthogonal to the front surface of the semiconductor substrate 40. In other words, the outer end of the p-type outer peripheral region 25 of the comparison example is free of steps.

From the results shown in FIG. 4, it was confirmed that in the comparison example, while the breakdown voltage of the edge termination region 2 is substantially constant independent of the impurity concentration ratio of the third outer peripheral region 28, the breakdown voltage is 1180V, which is significantly lower as compared to a design value of the breakdown voltage (reference breakdown voltage) for the active region 1. Here, the design value of the breakdown voltage for the active region 1 of the comparison example is a breakdown voltage (horizontal dashed line) that is slightly higher than 1600V. Thus, the comparison example is applicable to a MOSFET having a 1200V class breakdown voltage.

On the other hand, it was confirmed that in the experimental example, at the outer end of the p-type outer peripheral region 25, the steps are formed that are recessed stepwise toward the chip center and thereby, in the depth direction from the front surface of the semiconductor substrate 40, are arranged in ascending order of the proximity thereof to the chip center, whereby decreases in the breakdown voltage of the edge termination region 2 are suppressed and the breakdown voltage of the edge termination region 2 is closer to the design value for the breakdown voltage of the active region 1. Here, the design value for the breakdown voltage of the active region 1 of the experimental example is also a breakdown voltage (horizontal dashed line) slightly higher than 1600V.

Further, it was confirmed that in the experimental example, when the widths w1, w2, w3 of the steps formed at multiple depths at the outer end of the p-type outer peripheral region 25 are all the same width of 2 μm or more and the impurity concentration of the third outer peripheral region 28 is in a range of 0.1 times to 0.5 times the impurity concentration of the upper portions 24 of the $p^+$-type regions 22, the breakdown voltage of the edge termination region 2 is at least the design value of the breakdown voltage of the active region 1, and application to a MOSFET of a 1600V breakdown voltage class is possible.

Further, in the experimental example, it was confirmed that the breakdown voltage of the edge termination region 2 increases the wider are the widths w1, w2, w3 of the steps of the outer end of the p-type outer peripheral region 25 and the lower is the impurity concentration of the third outer peripheral region 28. In particular, it was confirmed that when the widths w1, w2, w3 of the steps of the outer end of the p-type outer peripheral region 25 were assumed to be 4 μm, the breakdown voltage of the edge termination region 2 increases by a maximum of 82V as compared to the design value of the breakdown voltage of the active region 1.

In the foregoing, the present invention is not limited to the described embodiments and various modifications within a range not departing from the spirit of the invention are possible. For example, the structure of the active region depicted in FIG. 2 is one example and instead of the trench gate structure, for example, the structure may be a planar gate structure. In other words, in the outer peripheral portion of the active region, the device structure of the active region may be suitably changed provided that the p-type outer peripheral region that surrounds the periphery of the center portion of the active region is formed so that at the outer end of the p-type outer peripheral region, steps are formed that are recessed stepwise toward the chip center and thereby, in the depth direction from the front surface of the semiconductor substrate, are arranged in ascending order of proximity thereof to the chip center.

Further, instead of the spatial modulation JTE structure, a general JTE structure may be provided in contact with the p-type outer peripheral region of the outer peripheral portion of the active region and the insulating film on the front surface of the semiconductor substrate. A general JTE structure is a structure in which multiple p-type regions (JTE regions) are disposed in descending order of impurity concentration thereof in a direction from the chip center to the chip end, in adjacent concentric shapes surrounding the periphery of the active region. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, the impurity concentration of the third outer peripheral region and the positions of the outer ends of the first to fourth outer peripheral regions are optimized, whereby electric field applied to the second-conductivity-type outer peripheral region may be mitigated. As a result, local concentration of electric field at the main junction end (outer corner portion of the bottom of the second-conductivity-type outer peripheral region) of the active region may be suppressed and avalanche breakdown capability at the main junction end of the active region is enhanced, whereby decreases in the breakdown voltage of the termination region may be suppressed.

Further, according to the invention described above, ion implantation mask patterns are suitably changed, whereby the steps may be formed at the outer end of the second-conductivity-type outer peripheral region without changing the method of forming the device structure of the active region. Further, the third outer peripheral region is formed at a different timing from those of the regions of the active region, whereby the impurity concentration of the third outer peripheral region may be suitably set without changing the method of forming the device structure of the active region.

The silicon carbide semiconductor device according to the invention achieves an effect in that a highly reliable silicon carbide semiconductor device that is easily formed and that is capable of stabilizing and ensuring a predetermined breakdown voltage may be provided.

As described, the silicon carbide semiconductor device according to the present invention is useful for power semiconductor devices used in power converting equipment, power source devices of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
- a semiconductor substrate containing silicon carbide and having a first main surface and a second main surface that are opposite to each other, an entire area of the first main surface being flat from a center to an end of the semiconductor substrate, the semiconductor substrate having
  - an active region at the center of the semiconductor substrate, and
  - a termination region that surrounds a periphery of the active region;
- a first semiconductor region of a first conductivity type, provided in the semiconductor substrate, and spanning the active region and the termination region;
- a device structure, including:
  - a second semiconductor region of a second conductivity type, provided in the semiconductor substrate, between the first main surface and the first semiconductor region and in the active region, to thereby form a pn junction between the first semiconductor region and the second semiconductor region, a current that passes through the pn junction flowing through the device structure,
  - a third semiconductor region of the first conductivity type, selectively provided in the semiconductor substrate and between the first main surface and the second semiconductor region,
  - a trench penetrating through the third semiconductor region and the second semiconductor region, and reaching the first semiconductor region,
  - a gate electrode provided in the trench via a gate insulating film, and
  - a plurality of second-conductivity-type high-concentration regions, selectively provided in the semiconductor substrate and between the first semiconductor region and the second semiconductor region, so as to be closer to the second main surface of the semiconductor substrate than is a bottom of the trench, the plurality of second-conductivity-type high-concentration regions having an impurity concentration that is higher than an impurity concentration of the second semiconductor region;
- a second-conductivity-type outer peripheral region formed entirely in the active region and at the periphery of the active region, the second-conductivity-type outer peripheral region being provided between the first main surface and the first semiconductor region, and between the device structure and the termination region;
- a voltage withstanding structure configured by a plurality of second-conductivity-type voltage withstanding regions, provided between the first main surface and the first semiconductor region and in the termination region, the plurality of second-conductivity-type voltage withstanding regions being provided apart from one another in a width direction that is parallel to the first main surface, in concentric shapes surrounding the periphery of the active region;
- a plurality of first electrodes electrically connected to the second semiconductor region, the third semiconductor region, and the second-conductivity-type outer peripheral region, the plurality of first electrodes being provided at the first main surface; and
- a second electrode electrically connected to the first semiconductor region, the second electrode being provided on the second main surface of the semiconductor substrate, wherein the second-conductivity-type outer peripheral region has a plurality of outer peripheral regions that include:
- a first outer peripheral region closest to the first main surface and in contact with an inner end of the voltage withstanding structure, the first outer peripheral region having a first surface and a second surface that are opposite to each other, the second surface of the first outer peripheral region facing the second main surface of the semiconductor substrate,
- a second outer peripheral region that is a portion of the second semiconductor region, and that is closer to the end of the semiconductor substrate than is the device structure, the second outer peripheral region being adjacent to the second surface of the first outer peripheral region, and having a first surface and a second surface that are opposite to each other, the second surface of the second outer peripheral region facing the second main surface of the semiconductor substrate,
- a third outer peripheral region adjacent to the second surface of the second outer peripheral region, and having a first surface and a second surface that are opposite to each other, the second surface of the third outer peripheral region facing the second main surface of the semiconductor substrate, and a fourth outer peripheral region adjacent to the second surface of the third outer peripheral region, a lower surface of the fourth outer peripheral region and a lower surface of each of the plurality of second-conductivity-type high-concentration regions being at a same depth, the first to fourth outer peripheral regions being arranged to form, at an outer end of the second-conductivity-type outer peripheral region, a plurality of steps that are recessed stepwise toward the center of the semiconductor substrate, so as to be in an ascending order of proximity to the center of the semiconductor substrate, in a depth direction from the first main surface to the second main surface of the semiconductor substrate, each of the plurality of steps having a same width in the width direction.

2. The silicon carbide semiconductor device according to claim 1, wherein an impurity concentration of the third outer peripheral region is lower than the impurity concentration of the plurality of second-conductivity-type high-concentration regions.

3. The silicon carbide semiconductor device according to claim 2, wherein the impurity concentration of the third outer peripheral region is within a range of 0.1 times to 0.5 times the impurity concentration of the plurality of second-conductivity-type high-concentration regions.

4. The silicon carbide semiconductor device according to claim 1, wherein an impurity concentration of the fourth outer peripheral region is equal to the impurity concentration of the plurality of second-conductivity-type high-concentration regions.

5. The silicon carbide semiconductor device according to claim 1, wherein the width of the plurality of steps at the outer end of the second-conductivity-type outer peripheral region is in a range of 1 μm to 4 μm.

6. The silicon carbide semiconductor device according to claim 1, wherein the plurality of second-conductivity-type high-concentration regions includes:

a first second-conductivity-type high-concentration region selectively provided in the semiconductor substrate and between the first semiconductor region and the second semiconductor region, the first second-conductivity-type high-concentration region facing the bottom of the trench and having an impurity concentration that is higher than the impurity concentration of the second semiconductor region, and a second second-conductivity-type high-concentration region selectively provided in the semiconductor substrate and between the first semiconductor region and the second semiconductor region, so as to be in contact with the second semiconductor region while being apart from the trench and the first second-conductivity-type high-concentration region, the second second-conductivity-type high-concentration region being closer to the second main surface than is the bottom of the trench, and having an upper surface and a lower surface, a lower portion of the second second-conductivity-type high-concentration region facing the second main surface, an impurity concentration of the second second-conductivity-type high-concentration region being higher than the impurity concentration of the second semiconductor region;

the first surface of the third outer peripheral region and the upper surface of the second second-conductivity-type high-concentration region are at a same depth, an impurity concentration of the third outer peripheral region being lower than the impurity concentration of the second second-conductivity-type high-concentration region; and an impurity concentration of the fourth outer peripheral region being equal to that of the lower portion of the second second-conductivity-type high-concentration region.

* * * * *